US010008669B2

United States Patent
Jiang et al.

(10) Patent No.: US 10,008,669 B2
(45) Date of Patent: Jun. 26, 2018

(54) ORGANIC PHOTOVOLTAIC ARRAY AND METHOD OF MANUFACTURE

(71) Applicants: Xiaomei Jane Jiang, Tampa, FL (US); Jason Erik Lewis, Lutz, FL (US)

(72) Inventors: Xiaomei Jane Jiang, Tampa, FL (US); Jason Erik Lewis, Lutz, FL (US)

(73) Assignee: University of South Florida, Tampa, FL (US)

( * ) Notice: Subject to any disclaimer, the term of this patent is extended or adjusted under 35 U.S.C. 154(b) by 0 days. days.

(21) Appl. No.: 14/816,222

(22) Filed: Aug. 3, 2015

(65) Prior Publication Data

US 2015/0357569 A1    Dec. 10, 2015

Related U.S. Application Data

(60) Division of application No. 13/907,416, filed on May 31, 2013, now Pat. No. 9,099,605, which is a (Continued)

(51) Int. Cl.
*H01L 31/00* (2006.01)
*H01L 51/00* (2006.01)
(Continued)

(52) U.S. Cl.
CPC ...... *H01L 51/0002* (2013.01); *H01L 31/0256* (2013.01); *H01L 31/0481* (2013.01);
(Continued)

(58) Field of Classification Search
CPC ............. H01L 51/0001; H01L 51/0002; H01L 51/0003; H01L 51/0021; H01L 51/0026; H01L 51/0027; H01L 51/0028

See application file for complete search history.

(56) References Cited

U.S. PATENT DOCUMENTS

| 6,054,809 A * | 4/2000 | Haynes .............. H01L 51/5203 313/505 |
| 2004/0187917 A1* | 9/2004 | Pichler ................... G02F 1/155 136/263 |

(Continued)

FOREIGN PATENT DOCUMENTS

WO    WO 2010132416 A2 *  11/2010 ......... H01L 51/5221

OTHER PUBLICATIONS

Boland et al., Thin Solid Films, 518, (2010), 1728-1731.*
(Continued)

*Primary Examiner* — Eli Mekhlin
(74) *Attorney, Agent, or Firm* — Molly L. Sauter; Robert J. Varkonyi; Smith & Hopen, P.A.

(57) ABSTRACT

The fabrication and characterization of large scale inverted organic solar array fabricated using all-spray process is disclosed, consisting of four layers; ITO-$Cs_2CO_3$-(P3HT:PCBM)-modified PEDPT:PSS, on a substrate. With PEDPT:PSS as the anode, the encapsulated solar array shows more than 30% transmission in the visible to near IR range. Optimization by thermal annealing was performed based on single-cell or multiple-cell arrays. Solar illumination has been demonstrated to improve solar array efficiency up to 250% with device efficiency of 1.80% under AM1.5 irradiance. The performance enhancement under illumination occurs only with sprayed devices, indicating device enhancement under sunlight, which is beneficial for solar energy applications. The semi-transparent property of the solar module allows for applications on windows and windshields, indoor applications, and soft fabric substances such as tents, military back-packs or combat uniforms, providing a highly portable renewable power supply for deployed military forces.

14 Claims, 14 Drawing Sheets

Related U.S. Application Data continuation of application No. PCT/US2012/025028, filed on Feb. 14, 2012.

(60) Provisional application No. 61/442,561, filed on Feb. 14, 2011.

(51) Int. Cl.
  *H01L 31/18* (2006.01)
  *H01L 31/0256* (2006.01)
  *H01L 31/048* (2014.01)
  *H01L 51/44* (2006.01)
  *H01L 51/42* (2006.01)

(52) U.S. Cl.
  CPC .......... *H01L 31/18* (2013.01); *H01L 51/0003* (2013.01); *H01L 51/0026* (2013.01); *H01L 51/0035* (2013.01); *H01L 51/0036* (2013.01); *H01L 51/0037* (2013.01); *H01L 51/0043* (2013.01); *H01L 51/4213* (2013.01); *H01L 51/4253* (2013.01); *H01L 51/448* (2013.01); *H01L 51/441* (2013.01); *H01L 2251/308* (2013.01); *Y02E 10/549* (2013.01)

(56) References Cited

U.S. PATENT DOCUMENTS

| | | | | |
|---|---|---|---|---|
| 2009/0301544 A1* | 12/2009 | Minelli | ................ | H01L 31/048 136/244 |
| 2010/0300536 A1* | 12/2010 | Aitken | ................... | C03C 3/064 136/260 |
| 2011/0186112 A1* | 8/2011 | Aernouts | .............. | H01L 27/302 136/249 |

OTHER PUBLICATIONS

English translation of First Office Action issued by the Chinese State Intellectual Property Office dated Jul. 6, 2015 for corresponding Chinese Application No. 201280004152.8.

Lim, Yee-Fun et al. Spray-deposited poly(3,4-ethylenedioxythiophene): poly(styrenesulfonate) top electrode for organic solar cells. Applied Physics Letters 93, 193301 (2008).

National Center for Biotechnology Information. PubChem Compound Database; CID=679, https://pubchem.ncbi.nlm.nih.gov/compound/679 (last accessed Mar. 6, 2017).

\* cited by examiner

ORGANIC PHOTOVOLTAIC ARRAY AND METHOD OF MANUFACTURE

CROSS REFERENCE TO RELATED APPLICATIONS

This application is a divisional of U.S. application Ser. No. 13/907,416, now U.S. Pat. No. 9,099,605, entitled "Organic Photovoltaic Array and Method of Manufacture", filed on May 31, 2013, which is a continuation of prior-filed International Application, Serial Number PCT/US2012/025028, entitled "Organic Photovoltaic Array and Method of Manufacture", filed Feb. 14, 2012, which claims priority to U.S. Provisional Patent Application 61/442,561, entitled, "Organic Photovoltaic Array and Method of Manufacture", filed Feb. 14, 2011, the contents of which are herein incorporated by reference.

FIELD OF INVENTION

This invention relates to spray-manufactured organic solar photovoltaic cell. Specifically, the invention provides a novel method of manufacturing organic solar photovoltaic cells using spray-deposition and the organic solar photovoltaic cell resulting therefrom.

BACKGROUND OF THE INVENTION

In recent years, energy consumption has drastically increased, due in part to increased industrial development throughout the world. The increased energy consumption has strained natural resources, such as fossil fuels, as well as global capacity to handle the byproducts of consuming these resources. Moreover, future demands for energy are expected in greatly increase, as populations increase and developing nations demand more energy. These factors necessitate the development of new and clean energy sources that are economical, efficient, and have minimal impact on the global environment.

Photovoltaic cells have been used since the 1970s as an alternative to traditional energy sources. Because photovoltaic cells use existing energy from sunlight, the environmental impact from photovoltaic energy generation is significantly less than traditional energy generation. Most of the commercialized photovoltaic cells are inorganic solar cells using single crystal silicon, polycrystal silicon or amorphous silicon. Traditionally, solar modules made from silicon are installed on rooftops of buildings. However, these inorganic silicon-based photovoltaic cells are produced in complicated processes and at high costs, limiting the use of photovoltaic cells. These silicon wafer-based cells are brittle, opaque substances that limit their use, such as on window technology where transparency is a key issue. Further, installation is an issue since these solar modules are heavy and brittle. In addition, installation locations, such as rooftops, are limited compared to the window area in normal buildings, and even less in skyscrapers. To solve such drawbacks, photovoltaics cell using organic materials have been actively researched.

The photovoltaic process in OPV first starts from the absorption of light mainly by the polymer, followed by the formation of excitons. The exciton then migrates to and dissociates at the interface of donor (polymer)/acceptor (fullerene). Separated electrons and holes travel to opposite electrodes via hopping, and are collected at the electrodes, resulting in an open circuit voltage (Voc). Upon connection of electrodes, a photocurrent (short circuit current, Isc) is created.

Organic photovoltaic cells based on π-conjugated polymers have been intensively studied following the discovery of fast charge transfer between polymer and carbon $C_{60}$ (Sariciftci, et al., Science 1992, 258, 1474; Yu, et al., Science 1995, 270, 1789; Yang and Heeger, Synth. Met. 1996, 83, 85; Shaheen, et al., Appl. Phys. Lett. 2001, 78, 841; Padinger, et al., Adv. Funct. Mater. 2003, 13, 85; Brabec, et al., Appl. Phys. Lett. 2002, 80, 1288; Ma, et al., Adv. Funct. Mater. 2005, 15, 1617; Reyes-Reyes, et al., High-efficiency photovoltaic devices based on annealed poly(3-hexylthiophene) and 1-(3-methoxycarbonyl)-propyl-1-phenyl-(6,6) $C_{61}$ blends. Appl. Phys. Lett. 2005, 87, 083506-9; Chen, et al., Polymer solar cells with enhanced open-circuit voltage and efficiency. Nat. Photonics, 2009, 3(11), 649-53). Conventional organic photovoltaic devices use transparent substrates, such as an indium oxide like indium tin oxide (ITO) or IZO, as an anode and aluminum or other metal as a cathode. A photoactive material including an electron donor material and an electron acceptor material is sandwiched between the anode and the cathode. The donor material in conventional devices is poly-3-hexylthiophene (P3HT), which is a conjugated polymer. The conventional acceptor material is (6,6)-phenyl $C_{61}$ butyric acid methylester (PCBM), which is a fullerene derivative. Both the ITO and aluminum contacts use sputtering and thermal vapor deposition, both of which are expensive, high vacuum, technologies. In these photovoltaic cells, light is typically incident on a side of the substrate requiring a transparent substrate and a transparent electrode. However, this limits the materials that may be selected for the substrate and electrode. Further, a minimum thickness of 30 to 500 nm is needed to increasing conductivity. Moreover, the organic photoelectric conversion layer is sensitive to oxygen and moisture, which reduce the power conversion efficiency and the life cycle of the organic solar cell. Development of organic photovoltaic cells, has achieved a conversion efficiency of 3.6% (P. Peumans and S. R. Forrest, Appl. Phys. Lett. 79, 126 (2001)).

The photovoltaic process in OPV first starts from the absorption of light mainly by the polymer, followed by the formation of excitons. The exciton then migrates to and dissociates at the interface of donor (polymer)/acceptor (fullerene). Separated electrons and holes travel to opposite electrodes via hopping, and are collected at the electrodes, resulting in an open circuit voltage ($V_{oc}$). Upon connection of electrodes, a photocurrent (short circuit current, $I_{sc}$) is created.

These polymeric OPV holds promise for potential cost-effective photovoltaics since it is solution processable. Large area OPVs have been demonstrated using printing (Krebs and Norrman, Using light-induced thermocleavage in a roll-to-roll process for polymer solar cells, ACS Appl. Mater. Interfaces 2 (2010) 877-887; Krebs, et al., A roll-to-roll process to flexible polymer solar cells: model studies, manufacture and operational stability studies, J. Mater. Chem. 19 (2009) 5442-5451; Krebs, et al., Large area plastic solar cell modules, Mater. Sci. Eng. B 138 (2007) 106-111; Steim, et al., Flexible polymer Photovoltaic modules with incorporated organic bypass diodes to address module shading effects, Sol. Energy Mater. Sol. Cells 93 (2009) 1963-1967; Blankenburg, et al., Reel to reel wet coating as an efficient up-scaling technique for the production of bulk heterojunction polymer solar cells, Sol. Energy Mater. Sol. Cells 93 (2009) 476-483), spin-coating and laser scribing (Niggemann, et al., Organic solar cell modules for specific applications—from energy autonomous systems to large area photovoltaics, Thin Solid Films 516 (2008) 7181-7187; Tipnis, et al., Large-area organic photovoltaic module—fabrication and performance, Sol. Energy Mater. Sol. Cells 93 (2009) 442-446; Lungenschmied, et al., Flexible, long-lived, large-area, organic solar cells, Sol. Energy Mater. Sol. Cells 91 (2007) 379-384), and roller painting (Jung and Jo, Annealing-free high efficiency and large area polymer solar cells fabricated by a roller painting process, Adv. Func. Mater. 20 (2010) 2355-2363). ITO, a transparent conductor, is commonly used as hole collecting electrode (anode) in OPV, and a normal geometry OPV starts from ITO anode, with the electron accepting electrode (cathode) usually a low work function metal such as aluminum or calcium, being added via thermal evaporation process.

There are two different approaches in inverted geometry. One approach is ITO-free wrap through by Zimmermann et. al., (Zimmermann, et al., ITO-free wrap through organic solar cells—A module concept for cost-efficient reel-to-reel production. Sol. Energy Mater. Sol. Cells, 2007, 91(5), 374) another approach is to add an electron transport layer onto ITO to make it function as cathode. Inverted geometry OPVs in which the device was built from modified ITO as cathode first have been studied both in single cells (Huang, et al., A Semi-transparent Plastic Solar Cell Fabricated by a Lamination Process. Adv. Mater. 2008, 20(3), 415; Bang-Ying Yu, et al., Efficient inverted solar cells using $TiO_2$ nanotube arrays. Nanotechnology, 2008, 19(25), 255202; Li, et al., Efficient inverted polymer solar cells. Appl. Phys. Lett. 2006, 88, 253503; Jingyu Zou, et al., Metal grid/conducting polymer hybrid transparent electrode for inverted polymer solar cells. Appl. Phys. Lett. 2010, 96, 203301; Waldauf, et al., Highly efficient inverted organic photovoltaics using solution based titanium oxide as electron selective contact. Appl. Phys. Lett. 2006, 89(23), 233517; Zhou, et al., Inverted and transparent polymer solar cells prepared with vacuum-free processing. Sol. Eng. & Sol. Cells 2009, 93(4), 497) and solar modules (Krebs and Norrman, Using Light-Induced Thermocleavage in a Roll-to-Roll Process for Polymer Solar Cells. ACS Applied materials & interfaces, 2010, 2, 877-87; Krebs, et al., A roll-to-roll process to flexible polymer solar cells: model studies, manufacture and operational stability studies. J. of Mater. Chem. 2009, 19, 5442-51; Krebs, et al., Large area plastic solar cell modules. Mater. Sci. Eng. B, 2007, 138(2), 106-11).

In addition, to improve efficiency of the organic thin film solar cell, photoactive layers were developed using a low-molecular weight organic material, with the layers stacked and functions separated by layer. (P. Peumans, V. Bulovic and S. R. Forrest, Appl. Phys. Lett. 76, 2650 (2000)). Alternatively, the photoactive layers were stacked with a metal layer of about 0.5 to 5 nm interposed to double the open end voltage ($V_{oc}$). (A. Yakimov and S. R. Forrest, Appl. Phys. Lett. 80, 1667 (2002)). As described above, stacking of photoactive layer is one of the most effective techniques for improving efficiency of the organic thin film solar cell. However, stacking photoactive layers can cause layers to melt due to solvent formation from the different layers. Stacking also limits the transparency of the photovoltaic. Interposing a metal layer between the photoactive layers can prevent solvent from one photoactive layer from penetrating into another photoactive layer and preventing damage to the other photoactive layer. However, the metal layer also reduces light transmittance, affecting power conversion efficiency of the photovoltaic cell.

However, in order for solar cells to be compatible with windows, issues with the transparency of the photovoltaic must first be addressed. The metal contacts used in traditional solar modules are visibility-blocking and has to be replaced. Another challenge is to reduce cost for large scale manufacturing in order for organic solar cells to be commercially viable, a much lower manufacturing cost to compensate for the lower efficiency than current photovoltaic products. OPV modules fabricated by other large scale manufacturing techniques such as printing (Krebs and Norrman, Using Light-Induced Thermocleavage in a Roll-to-Roll Process for Polymer Solar Cells. ACS Applied materials & interfaces, 2010, 2, 877-87; Krebs, et al., A roll-to-roll process to flexible polymer solar cells: model studies, manufacture and operational stability studies. J. of Mater. Chem. 2009, 19, 5442-51; Krebs, et al., Large area plastic solar cell modules. Mater. Sci. Eng. B, 2007, 138(2), 106-11; Jung and Jo, Annealing-free high efficiency and large area polymer solar cells fabricated by a roller painting process, Adv. Func. Mater. 20 (2010) 2355-2363) and spin-coating (Tipnis, et al., Large-area organic photovoltaic module—Fabrication and performance. Sol. Energy Mater. Sol. Cells, 2009, 93(8), 442-6; Lungenschmied, et al., Flexible, long-lived, large-area, organic solar cells. Sol. Energy Mater. Sol. Cells, 2007, 9(5), 379-84) have been demonstrated, however, all these still involve the use of metal in certain way. For example, a solution-based all-spray device, which was opaque, showed a PCE as high as 0.42% (Lim, et al., Spray-deposited poly(3,4-ethylenedioxythiophene):poly (styrenesulfonate) top electrode for organic solar cells, Appl. Phys. Lett. 93 (2008) 193301-4). Large-scale manufacturing techniques, such as printing, have lowered the cost of manufacture, but still involve the use of metal in certain way, and therefore affect the transparency of the photovoltaic cell.

Therefore, what is needed is a new method of manufacturing organic photovoltaic cells without the use of metal, to allow for novel photovoltaic cells with enhanced transparency. The art at the time the present invention was made did not describe how to attain these goals, of manufacturing less expensive and less complex devices, having enhanced transparency.

SUMMARY OF THE INVENTION

Comparing with conventional technology based on spin-coating and using metal as cathode contact, which greatly limits transparency of solar cells and posts difficulty for large scale manufacturing, the new spray technology solves these two problems simultaneously. A thin film organic solar array is fabricated employing this layer-by-layer spray technique onto desired substrates (can be rigid as well as flexible). This technology eliminates the need for high-vacuum, high temperature, low rate and high-cost manufacturing associated with current silicon and in-organic thin film photovoltaic products.

The organic solar photovoltaic cell is manufactured on an ITO-coated substrate, such as cloth, glass, plastic or any material known in the art for use as a photovoltaic substrate. Exemplary plastics include any polymer such as acrylonitrile butadiene styrene (ABS), acrylic (PMMA), cyclic olefin copolymer (COC), ethylene-vinyl acetate (EVA), ethylene vinyl alcohol (EVOH), fluoroplastics, such as PTFE, FEP, PFA, CTFE, ECTFE, and ETFE, Kydex (an acrylic/PVC alloy), liquid crystal polymer (LCP), polyoxymethylene (POM or Acetal), polyacrylates (acrylic), polyacrylonitrile (PAN or acrylonitrile), polyamide (PA or nylon), polyamide-imide (PAI), polyaryletherketone (PAEK or ketone), polybutadiene (PBD), polybutylene (PB), polychlorotrifluoroethylene (PCTFE), polycyclohexylene dimethylene terephthalate (PCT), polycarbonate (PC), polyhydroxyalkanoates (PHAs), polyketone (PK), polyester, polyetherketoneketone (PEKK), polyetherimide (PEI), polyethersulfone (PES), chlorinated polyethylene (CPE), polyimide (PI), polymethylpentene (PMP), polyphenylene oxide (PPO), polyphenylene sulfide (PPS), polypropylene (PP), polystyrene (PS), polysulfone (PSU), polytrimethylene terephthalate (PTT), polyurethane (PU), polyvinyl acetate (PVA), styrene-acrylonitrile (SAN). The ITO layer was optionally patterned onto the first face of the glass, forming an anode, by obtaining an ITO-coated substrate, patterning the ITO using photolithography, etching the ITO, and cleaning the etched ITO and substrate. The ITO may be etched with a mixed solution of HCl and $HNO_3$. The etched ITO and substrate was then optionally cleaned by at least one of acetone, isopropanol, or UV-ozone. The cleaning step may be performed at 50° C. for 20 min each, followed by drying with $N_2$.

A layer of $Cs_2CO_3$ was prepared and sprayed onto the etched ITO substrate. In some variations, the layer of $Cs_2CO_3$ was prepared by dissolving $Cs_2CO_3$ in 2-ethoxyethanol at a ratio of 2 mg/ml, and stirred for 1 hour. After the $Cs_2CO_3$ layer was sprayed onto the OPV cell, the layer was annealed to the OPV cell inside a glovebox. Optionally, the annealing step occurred at 150° C. for 10 min inside the $N_2$ glovebox. The $Cs_2CO_3$ layer has an optional thickness of about 5 Å to about 15 Å.

After the $Cs_2CO_3$ layer was annealed, an active layer of P3HT and PCBM was prepared and sprayed onto the OPV cell. The active layer solution was optionally prepared my mixing P3HT and PCBM with a weight ratio of 1:1 in dichlorobenzene. The active layer was then optionally stirred on a hotplate for 48 h at 60° C. prior to spraying. After spraying, the OPV cell was dried in an antechamber under vacuum for at least 12 hours. The active layer of has an optional layer thickness of about 100 nm to about 500 nm, depending on the organic photovoltaic cell materials and transparency requirements. A layer comprising poly(3,4)ethylenedioxythiophene:poly-styrenesulfonate and 5 vol. % of dimethylsulfoxide was then disposed on the active layer, providing the cathode for the photovoltaic cell. Optionally, the poly(3,4)ethylenedioxythiophene:poly-styrenesulfonate mixed with 5 vol. % of dimethylsulfoxide was prepared diluting the poly(3,4)ethylenedioxythiophene:poly-styrenesulfonate filtering the diluted poly(3,4)ethylenedioxythiophene:poly-styrenesulfonate through a 0.45 µm filter, and mixing the dimethylsulfoxide into the diluted poly(3,4)ethylenedioxythiophene:poly-styrenesulfonate. In some variations, this cathodic layer has a thickness of about 100 nm to about 700 nm, and may be 600 nm in some variations. Exemplary thicknesses include 200 nm, 250 nm, 300 nm, 350 nm, 400 nm, 450 nm, 550 nm, 600 nm, 650 nm, and 700 nm.

The OPV cell was placed into high vacuum for 1 h, such as at $10^{-6}$ Torr. The OPV cell was then annealed at 120° C., 160° C., or at 120° C. for 10 minutes followed by high vacuum for 1 hour and annealing at 160° C. for 10 minutes and encapsulated with a UV-cured epoxy.

The photovoltaic cells may also be in electrical connection, thereby forming an array. For example, a series of organic solar photovoltaic cells disposed into an array of 50 individual cells having active area of 12 $mm^2$. The array comprises 10 cells disposed in series in one row, and 5 rows in parallel connection in some variations.

The inventive device and method has solved the costly and complicated process currently used to make crystalline and thin film solar cells, namely, high-vacuum, high temperature, low rate and high-cost manufacturing. Furthermore, this technology could be used on any type of substrate including cloth and plastic. This new technology enables all solution processable organic solar panel on with transparent contacts. This technique has great potential in large-scale, low-cost manufacturing of commercial photovoltaic products based on solutions of organic semiconductors. The use of self assembled molecules (SAM) modify the work function of ITO, and SAM was used in place of the previous $Cs_2CO_3$ improving the device efficiency and reproducibility.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
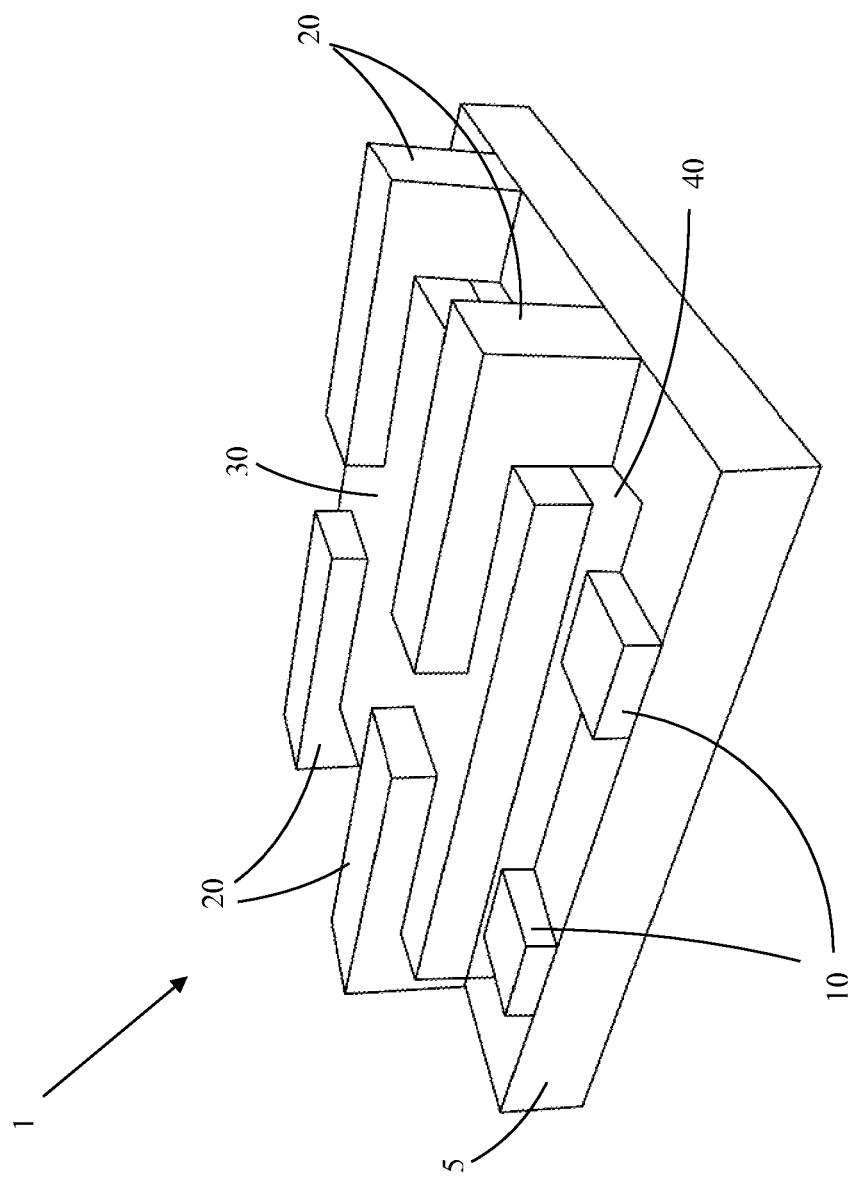
FIG. 1 is a diagram showing a perspective view of the novel inverted OPV cells containing sprayed-on layers.

The present invention for the fabrication of a see-through organic solar array via layer-by-layer (LBL) spray may be understood more readily by reference to the following detailed description of the preferred embodiments of the invention and the Examples included herein. However, before the present compounds, compositions, and methods are disclosed and described, it is to be understood that this invention is not limited to specific compounds, specific conditions, or specific methods, etc., unless stated as such. Thus, the invention may vary, and the numerous modifications and variations therein will be apparent to those skilled in the art. It is also to be understood that the terminology used herein is for the purpose of describing specific embodiments only and is not intended to be limiting.

As used herein, "about" means approximately or nearly and in the context of a numerical value or range set forth means±15% of the numerical.

As used herein, "substantially" means largely if not wholly that which is specified but so close that the difference is insignificant.

All masks for spray are custom made by Towne Technologies, Inc. The airbrush sets for spray was purchased from ACE hardware.

Example 1

The indium tin oxide (ITO) was patterned onto a Corning® low alkaline earth boro-aluminosilicate glass having a nominal sheet resistance of 4-10 Ohm/square (Delta Technology, Inc.) using standard photolithography method and cleaned following the procedure described elsewhere (Lewis, et al., Fabrication of organic solar array for applications in microelectromechanical systems. Journal of Renewable and Sustainable Energy 2009, 1, 013101-9). The substrate is then exposed to a UV-lamp for 1.4 seconds in a constant intensity mode set to 25 watts. The structure was developed for about 2.5 minutes using Shipley MF319 and rinsed with water. The substrate was then hard-baked, at 145° C. for 4 minutes and any excess photoresist cleaned off with acetone and cotton. After cleaning, the substrate was etched from about 5-11 minutes with a solution of 20% HCl-7% $HNO_3$ on a hotplate at 100° C. The etched substrate was then cleaned by hand using acetone followed by isopropanol and UV-ozone cleaned for at least 15 minutes.

An interstitial layer was formed on top of the patterned ITO layer. A solution of 0.2% wt. $Cs_2CO_3$ (2 mg/mL; Sigma-Aldrich Co. LLC, St. Louis, Mo.) in 2-ethoxyethanol was prepared and stirred for one hour at room temperature. $Cs_2CO_3$ was chosen to reduce ITO work function close to 4.0 eV to be utilized as cathode. The $Cs_2CO_3$ solution was sprayed onto the clean ITO substrate through a custom made shadow mask with an airbrush using $N_2$ set to 20 psi from a distance of about 7-10 centimeters. The product was then annealed for 10 minutes at 150° C. in an $N_2$ glovebox (MOD-01; M. Braun Inertgas-Systeme GmbH, Garching German).

The active layer solution was prepared by mixing separate solutions of a high molecular weight poly(3-hexylthiophene (P3HT with regioregularity over 99% and average molecular weight of 42K; Rieke Metals, Inc., Lincoln, Nebr.) and 6,6-phenyl C61 butyric acid methyl ester (PCBM, $C_{60}$ with 99.5% purity; Nano-C, Inc., Westwood, Mass.) at a weight ratio of 1:1 in dichlorobenzene at 20 mg/mL and stirred on a hotplate for 48 hours at 60° C. The active coating was then spray coated onto the $Cs_2CO_3$ coated substrate using an airbrush with $N_2$ set to 30 psi. The airbrush was set at about 7-10 cm away from the substrate and multiple light layers of active layer were sprayed, resulting in a layer thickness of about 200 to about 300 nm. The device is then left to dry in the antechamber under vacuum for at least 12 hours. After drying, excess active layer solution was wiped off of the substrate using dichlorobenzene (DCB)-wetted cotton followed by isopropanol-wetted cotton.

A kovar shadow mask was aligned in position with the substrate and held in place by placing a magnet underneath the substrate. The series connection locations were wiped using a wooden dowel to expose the cathode for later electrical connection. The original aqueous poly(3,4)ethylenedioxythiophene:poly-styrenesulfonate (PEDOT:PSS, Baytron 500 and 750; H. C. Starck GmbH, Goslar Germany) was diluted and filtered out through a 0.45 µm filter. This filtered solution of PEDOT:PSS is mixed with 5 vol. % of dimethylsulfoxide to increase conductivity (Lim, et al., Spray-deposited poly(3,4-ethylenedioxythiophene):poly (styrenesulfonate) top electrode for organic solar cells. Appl. Phys. Lett. 2008, 93, 193301). The solution was then stirred at room temperature followed by 1 h of sonification. The m-PED coating was prepared by placing a substrate/mask on a hotplate (90° C.). The m-PED layer was spray coated using nitrogen ($N_2$) as the carrier gas, set to 30 psi, with the airbruch positioned about 7-10 cm from the substrate. Multiple light layers were applied until the final thickness of about 500 nm to about 700 nm was reached. The substrate was then removed from the hotplate and the mask removed. Care was taken to avoid removing the mPED with the mask. The substrate was placed into high vacuum treatment ($10^{-6}$ Torr) for 1 h, followed by a substrate annealing at 120-160° C. for 10 min. The modified PEDOT:PSS (m-PEDOT) was then sprayed onto the substrate using a custom made spray mask.

The finished device was placed into high vacuum ($10^{-6}$ Torr) for 1 h. This step was shown to improve the device performance with sprayed active layer (Lim, et al., Spray-deposited poly(3,4-ethylenedioxythiophene):poly(styrenesulfonate) top electrode for organic solar cells. Appl. Phys. Lett. 2008, 93, 193301). The final device was annealed at various conditions, including 120° C., 160° C., and step annealing comprising 120° C. for 10 minutes followed by high vacuum for 1 hour and annealing at 160° C. for 10 minutes. The annealed device was encapsulated using a UV-cured encapsulant (EPO-TEK OG142-12; Epoxy Technology, Inc., Billerica, Mass.) was applied to the edge of the encapsulation glass, and the glass is placed into the glovebox for at least 15 min, with UV exposure. The device was then flipped upside down, and the epoxy applied on top of the encapsulation glass. The device was finally exposed to 15 min of UV to cure the encapsulant epoxy.

Example 2

Figure 2A:
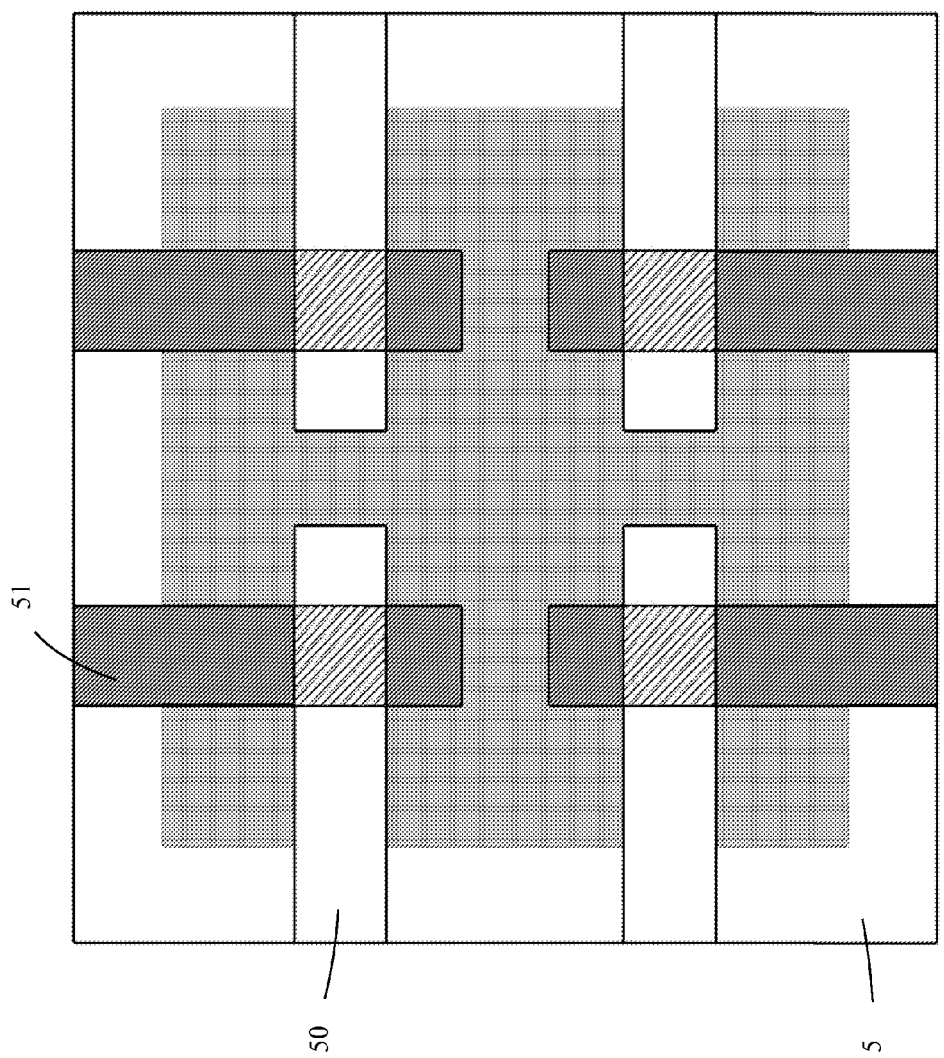
FIGS. 2(A) and (B) are images of the device structure of an inverted test device. (A) top view; (B) side view.

Inverted organic photovoltaic cell 1, seen in FIG. 1, was created using the method described in Example 1, using pre-cut 4"×4" ITO glass substrates with a nominal sheet resistance of 4-10 Ohm/square and Corning® low alkaline earth boro-aluminosilicate glass (Delta Technology, Inc., Tallahassee, Fla.). Inverted photovoltaic cell 1 was composed of different layers of active materials and terminals (anode and cathode) built onto substrate 5. Anode 10, comprised of ITO in the present example, was sprayed onto substrate 5 forming a '¦ ¦' pattern extending from a first set of edges of substrate 5. Interstitial layer 40 covers anode 10, except for the outermost edges, as seen in FIG. 2(A), and permits ITO to be used as an anode as discussed in Example 1. The components of the SAM layer were chosen to provide a gradient for charges crossing the interface, approximating a conventional p-n junction with organic semiconductors, thereby providing an increased efficiency of heterojunctions. Active layer 30 is disposed directly on top of interfacial buffer layer 40, and was prepared using poly(3-hexylthiophene) and 6,6-phenyl C61 butyric acid methyl ester. Anode 20 was disposed on the active layer in a pattern, similar to the cathode, but perpendicular to the cathode. Exemplary anode materials include PEDOT:PSS doped with dimethylsulfoxide. The fully encapsulated 4 μm×4 μm array was found to possess over 30% transparency.

Example 3

Figure 2B:
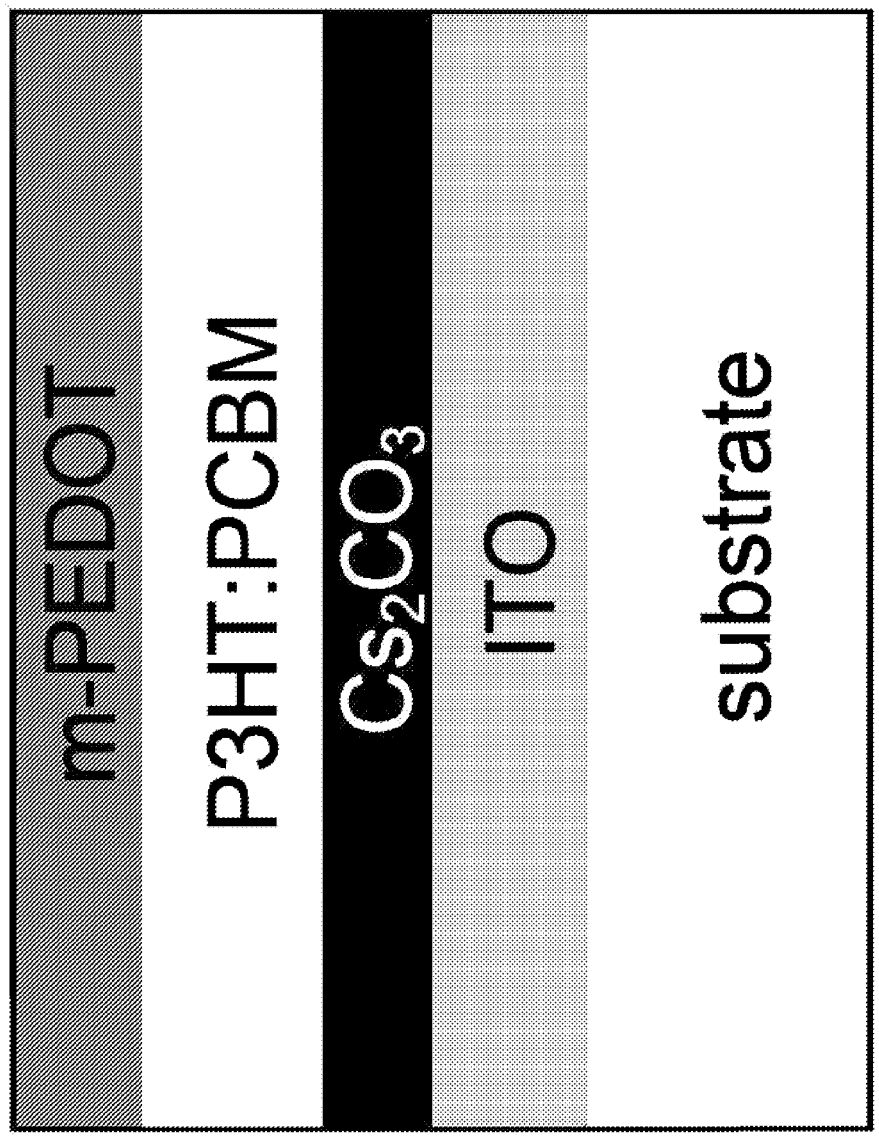

An inverted single-cell test device was used as a starting point to ensure a good reference point for the multi-cell array, which consists of four identical small cells (4 mm$^2$) on a 1"×1" substrate, as seen in FIG. 2(B). The cell is sandwiched between two cross electrodes, designated as 50 and 51. The test device was fabricated using the same procedure described in Example 1, with m-PEDOT 500 as anode.

ITO normally has a work function of ~4.9 eV. The function of ITO in a traditional OPV device is as an anode. There have been previous reports on tuning the work function of ITO by adding an electron transport layer such as ZnO (Jingyu Zou, et al., Metal grid/conducting polymer hybrid transparent electrode for inverted polymer solar cells. Appl. Phys. Lett. 2010, 96, 203301), TiO$_2$ (Huang, et al., A Semi-transparent Plastic Solar Cell Fabricated by a Lamination Process. Adv. Mater. 2008, 20(3), 415; Bang-Ying Yu, et al., Efficient inverted solar cells using TiO$_2$ nanotube arrays. Nanotechnology, 2008, 19(25), 255202; Li, et al., Efficient inverted polymer solar cells. Appl. Phys. Lett. 2006, 88, 253503), PEO (Zhou, et al., Inverted and transparent polymer solar cells prepared with vacuum-free processing. Sol. Eng. & Sol. Cells 2009, 93(4), 497) and Cs$_2$CO$_3$ (Huang, et al., A Semi-transparent Plastic Solar Cell Fabricated by a Lamination Process. Adv. Mater. 2008, 20(3), 415; Bang-Ying Yu, et al., Efficient inverted solar cells using TiO$_2$ nanotube arrays. Nanotechnology, 2008, 19(25), 255202; Li, et al., Efficient inverted polymer solar cells. Appl. Phys. Lett. 2006, 88, 253503) in inverted OPV single cells. In this work, Cs$_2$CO$_3$ was chosen for its economic cost and easy handling. By spin coating a solution of 2-ethoxyethanol with 0.2% Cs$_2$CO$_3$ at 5000 rpm for 60 s, a very thin layer (~10 Å) of Cs$_2$CO$_3$ is formed over the ITO. It was reported that a dipole layer would be created between Cs$_2$CO$_3$ and the ITO. The dipole moment helped to reduce the work function of ITO, allowing ITO to serve as the cathode (Huang, et al., A Semi-transparent Plastic Solar Cell Fabricated by a Lamination Process. Adv. Mater. 2008, 20(3), 415; Bang-Ying Yu, et al., Efficient inverted solar cells using TiO$_2$ nanotube arrays. Nanotechnology, 2008, 19(25), 255202; Li, et al., Efficient inverted polymer solar cells. Appl. Phys. Lett. 2006, 88, 253503).

Figure 3:
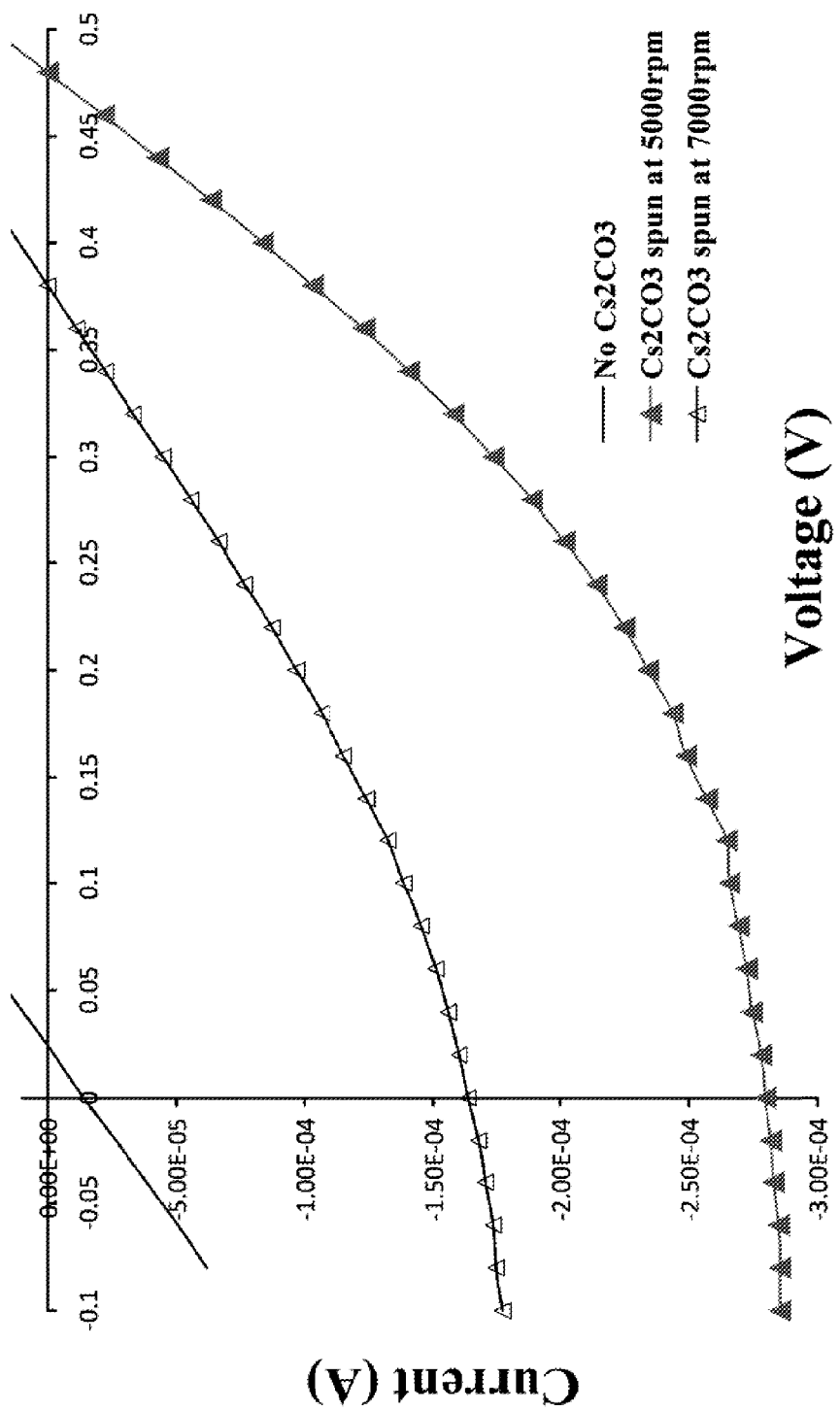
FIG. 3 is a graph showing the I-V characteristics of three test devices without $Cs_2CO_3$ layer (black solid line), and with $Cs_2CO_3$ layer at difference thickness (black line with empty triangle and line with filled triangle).

FIG. 3 shows how the Cs$_2$CO$_3$ layer affects the performance of the inverted cell. The control cell without Cs$_2$CO$_3$ (black solid line) performed almost like a resistor and had negligible $V_{oc}$ (0.03V). Without being bound to any specific theory, the difference between the present invention and previous work (Zhou, et al., Inverted and transparent polymer solar cells prepared with vacuum-free processing. Sol. Eng. & Sol. Cells 2009, 93(4), 497) can be explained by the use of an electron transport layer to alleviate non-ohmic contact with the cathode (PEDOT in this case) in their work. For a better controlled thickness, Cs$_2$CO$_3$ was spin coated on to the cleaned ITO substrate in these devices. As shown in FIG. 3, the optimal thickness of Cs$_2$CO$_3$ layer was achieved at a spin rate of 5000 rpm. At higher rate of 7000 rpm, the device was less efficient owing to the fact of a discontinuous Cs$_2$CO$_3$ layer. The optimal thickness was later determined to be around 15 Å.

Previous reports showed Cs$_2$CO$_3$ can lower the ITO work function to as low as 3.3 eV (Huang, et al., A Semi-transparent Plastic Solar Cell Fabricated by a Lamination Process. Adv. Mater. 2008, 20(3), 415; Bang-Ying Yu, et al., Efficient inverted solar cells using TiO$_2$ nanotube arrays. Nanotechnology, 2008, 19(25), 255202; Li, et al., Efficient inverted polymer solar cells. Appl. Phys. Lett. 2006, 88, 253503). In order to get an estimate of the effective work function of ITO/Cs$_2$CO$_3$, a control device with aluminum (100 nm in thickness) as cathode was fabricated. Since aluminum is not transparent, the I-V was measured by shining light from m-PEDOT side. The device was analyzed by exposing the cell to continuous radiation. The current-voltage (I-V) characterization of the solar array was performed with a 1.6 KW solar simulator under AM1.5 irradiance of 100 mW/cm$^2$ (Newport Corp., Franklin Mass.). No spectral mismatch with the standard solar spectrum was corrected in the power conversion efficiency (PCE) calculation. The incident photon converted electron (IPCE), or the external quantum efficiency, of the device was measured using 250 W tungsten halogen lamp coupled with a monochromator (Newport Oriel Cornerstone ¼ m). The photocurrent was detected by a UV enhanced silicon detector connected with a Keithley 2000 multimeter. The transmission spectrum of active layer was performed on the same optical setup. $V_{oc}$ of such control device was 0.24V, whereas $V_{oc}$ of the inverted cell in FIG. 3 was 0.36V measured under the same illumination condition. Since aluminum has work function of 4.2 eV, this means in the present invention, the effective work function of ITO/Cs$_2$CO$_3$ is close to 4.1 eV.

Example 4

Figure 4A:
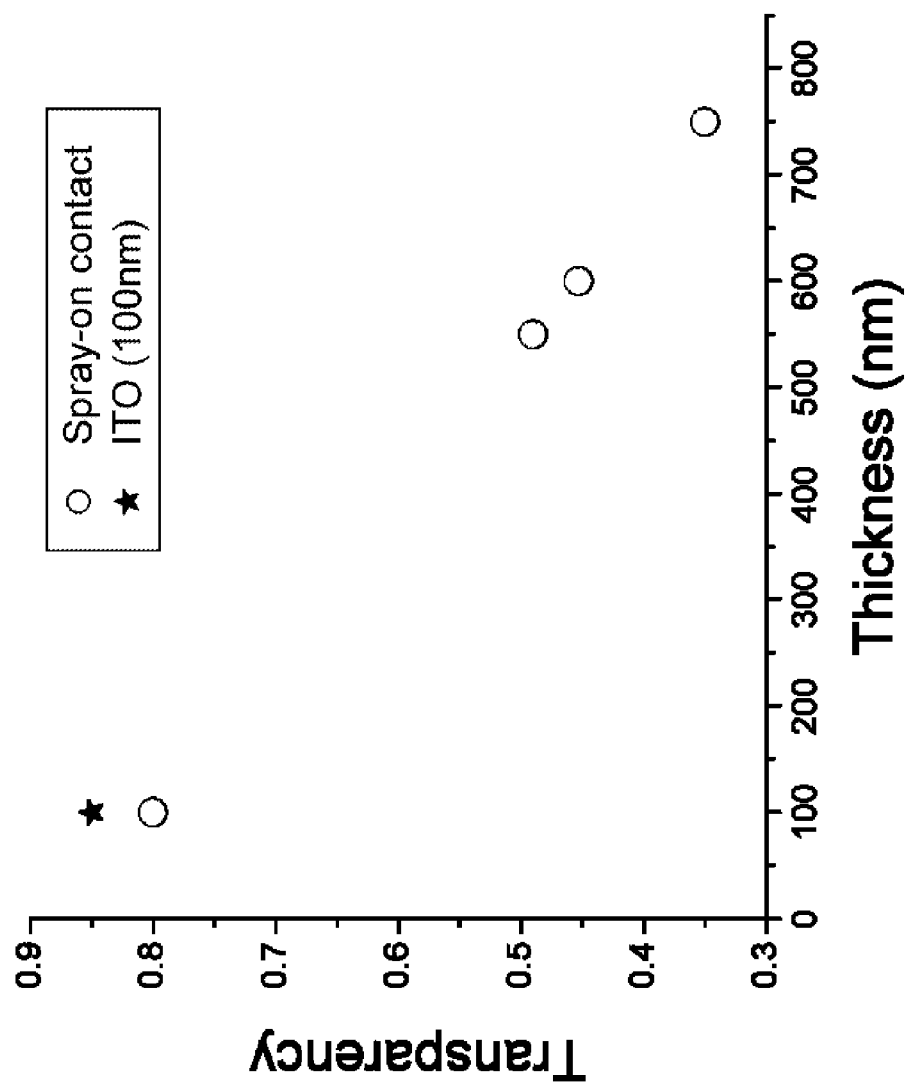
FIGS. 4(A) and (B) are graphs showing the comparison of (A) transparency and (B) resistance between ITO and the anode (modified PEDOT:PSS) at different thickness.
Figure 4B:
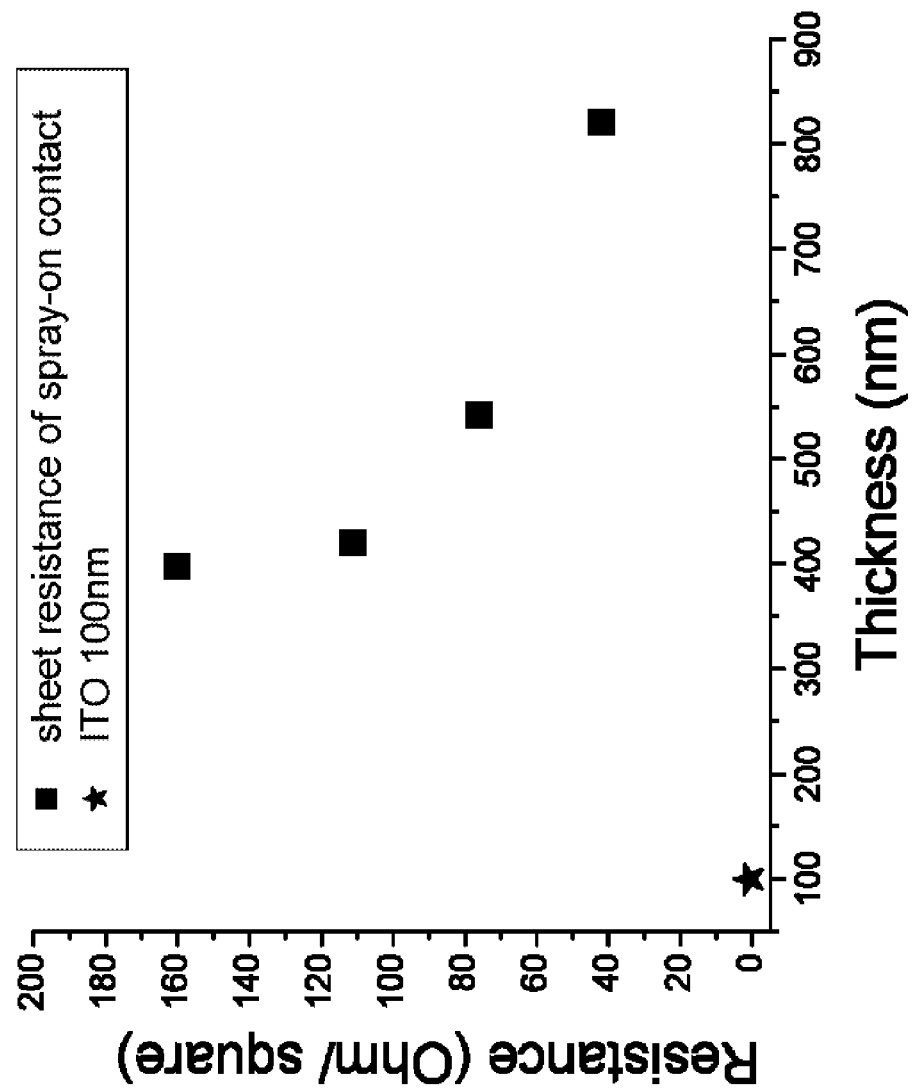
Figure 5:
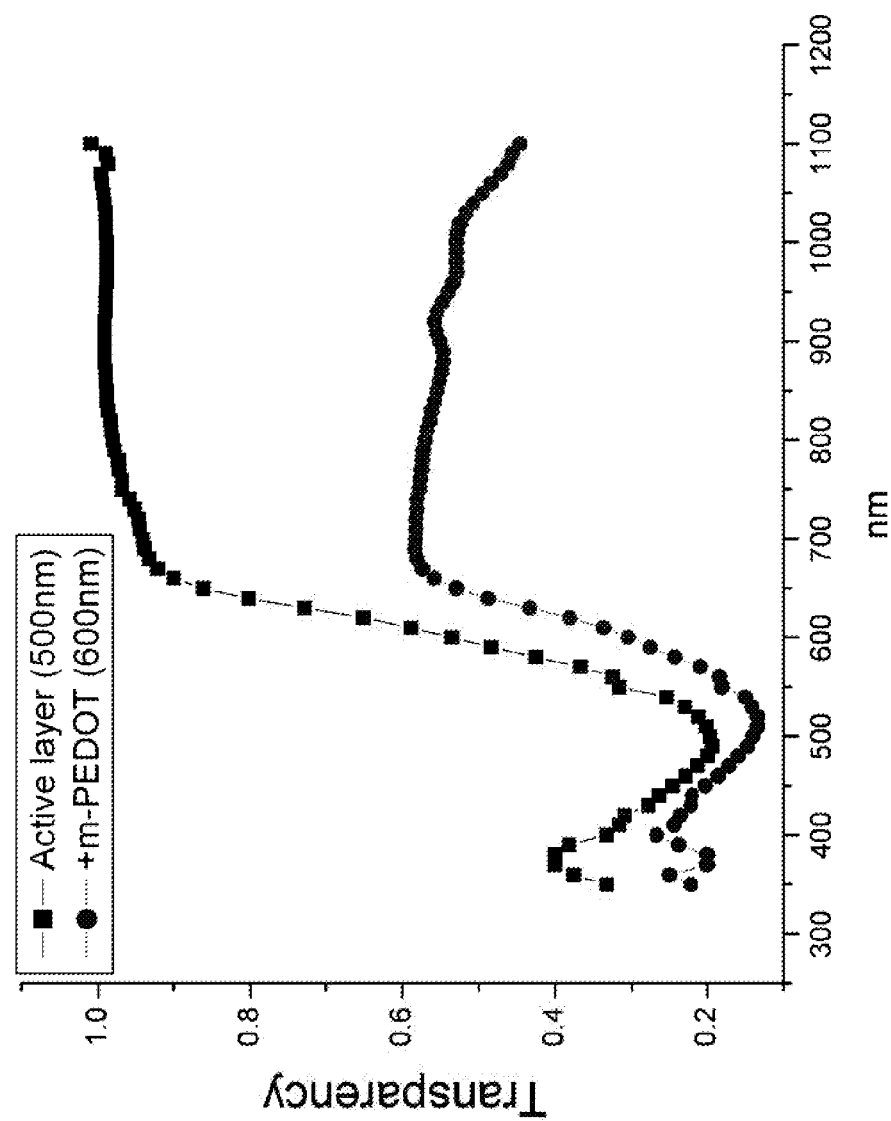
FIG. 5 is a graph showing the transmission spectra of an active layer (P3HT:PCBM) of 500 nm (black line with filled square), and with a m-PEDOT:PSS layer of 600 nm (gray line with filled circle).

An inverted single-cell test device was prepared, as discussed in Example 1, but using different thicknesses of m-PEDOT to determine cell characteristics at different cell thicknesses. ITO was chose as a reference for comparison. At thickness of about 100 nm, the transparency of m-PEDOT is about 80%, comparable with ITO, as seen in FIG. 4(A). As expected, the resistance decreases as thickness increases, which is consistent with the bulk model, seen in FIG. 4(B). The trade-off between transparency and resistance is another important fabrication parameter. The current array was fabricated with thickness of about 600 nm, which has moderate resistance of 70 ohm/square, and transparency about 50%. A comparison between transmission spectra of the active layer (P3HT:PCBM, 200 nm) and m-PEDOT anode of 600 nm showed the total transparency over the spectra range shown decreases from 73% to 31% after spraying on the m-PEDOT anode, as seen in FIG. 5.

Figure 6:
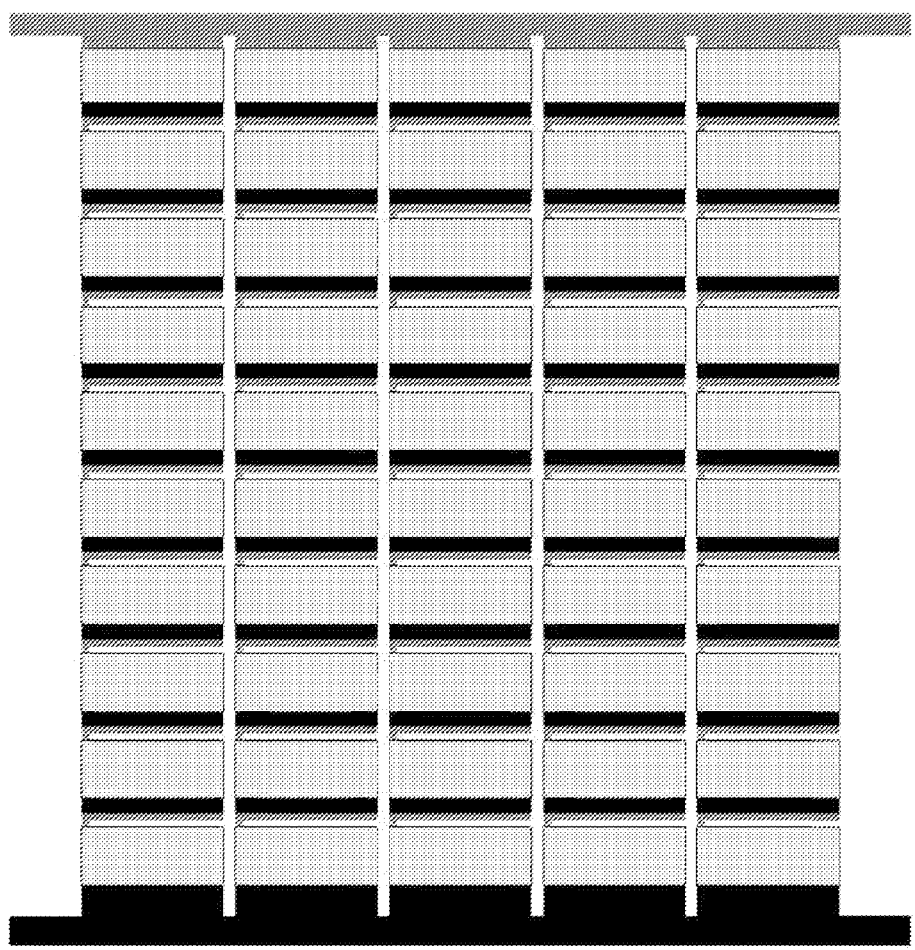
FIG. 6 is a top-view image of the device architecture of an inverted array having 50 cells in the array.
Figure 7:
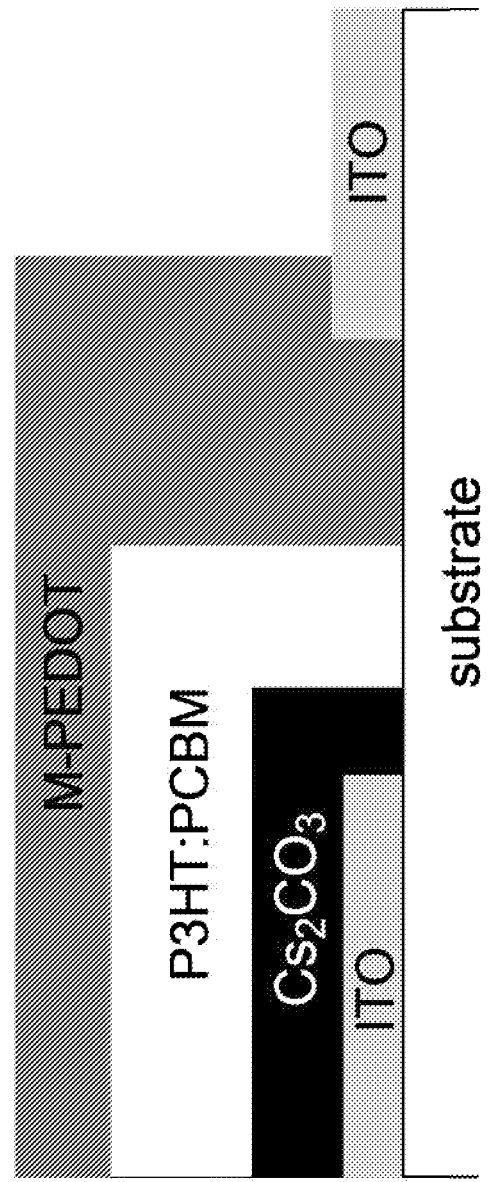
FIG. 7 is a side-view image of the device architecture of an inverted array.

A solar array was prepared, as disclosed above, comprising 50 individual cells each has active area of 12 mm$^2$, seen in FIG. 6. The array was configured with 10 cells in series to increase in one row to increase voltage, and 5 rows in parallel connection to increase current, seen in cross section in FIG. 7. The arrays were prepared with have m-PEDOT 750 or m-PEDOT 500 as semitransparent anode.

Example 5

Figure 8:
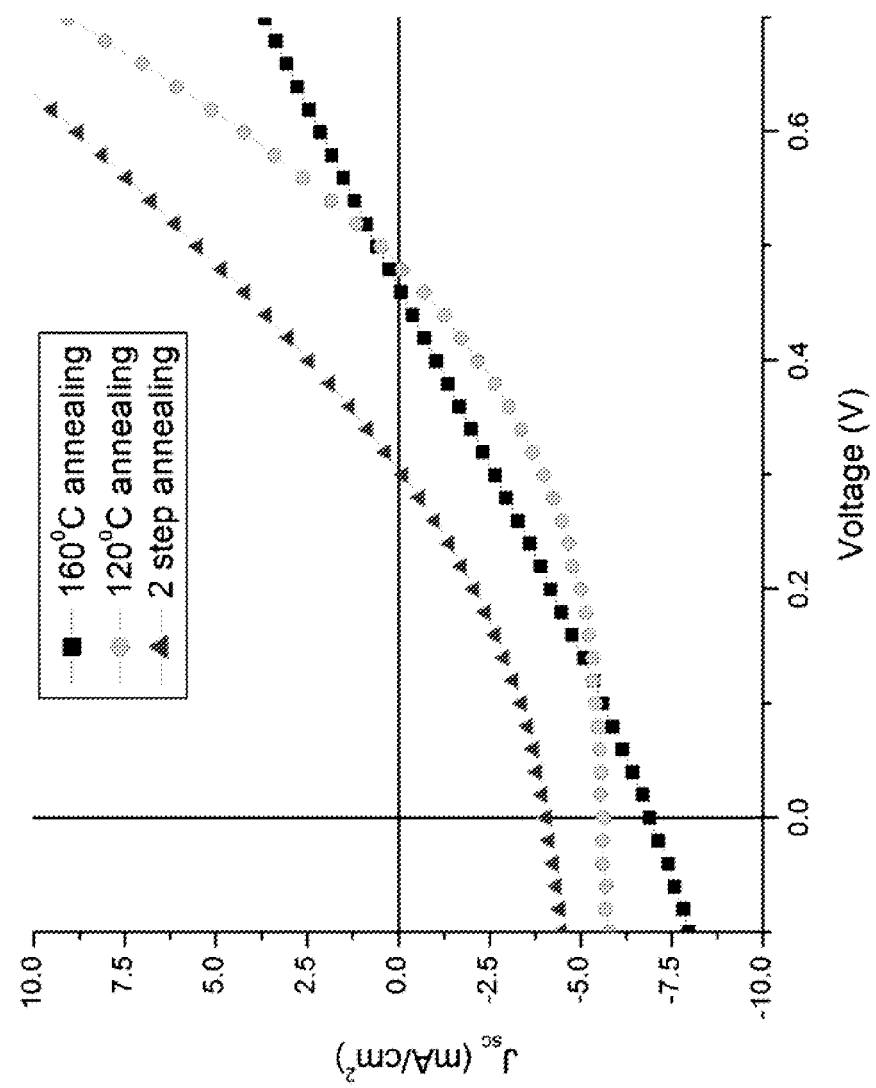
FIG. 8 is a graph showing the IV of four test cells measured with AM1.5 solar illumination under various annealing conditions: 1-step annealing at 120° C. (light grey filled circle), or 160° C. (black filled square), and 2-step annealing (dark grey filled triangle).

Annealing has shown to be the most important factor to improve organic solar cell performance (Shaheen, Brabec, Sariciftci, Padinger, Fromherz, and Hummelen, Appl. Phys. Lett. 2001, 78, 841; Padinger, et al., Effects of Postproduction Treatment on Plastic Solar Cells. Adv. Funct. Mater. 2003, 13(1), 85-88). Cells were exposed to a 1.6 KW solar simulator under AM1.5 irradiance of 100 mW/cm² (Newport Corp., Franklin Mass.). Current-voltage (IV) and incident photon converted electron (IPCE) were compared between three inverted test cells at different annealing conditions, as seen in FIG. 8: 1-step annealing at 120° C. (gray filled circle), or 160° C. (black filled square); 2-step annealing at 120° C. for 10 minutes, followed by high vacuum for 1 hour and annealing at 160° C. for 10 minutes. One-step annealing at 120° C. gives the best result in test cell, as seen in FIG. 8, with $V_{oc}$=0.48V, $I_{sc}$=0.23 mA, FF=0.44, and a power conversion efficiency (PCE) of 1.2% under AM1.5 solar illumination with intensity 100 mW/cm². The second annealing step at 160° C. worsens the device performance, mainly due to unfavorable change of film morphology, which was confirmed in AFM images (data not shown). The PCE of 1-step annealing at 160° C. was in between that of 1-step annealing at 120° C. and 2-step annealing, yet the device has the worst FF. Table 1 listed the details of the IV characteristics of these three test cells.

TABLE 1

Test cell I-V characteristics comparison at various annealing conditions.

| Test cell number | $I_{sc}$ (mA) | $V_{oc}$ (V) | FF | η (%) | Annealing condition |
|---|---|---|---|---|---|
| 1 | 0.28 | 0.48 | 0.26 | 0.86 | 160° C. 10 min |
| 2 | 0.23 | 0.48 | 0.44 | 1.2 | 120° C. 10 min |
| 3 | 0.16 | 0.30 | 0.35 | 0.43 | 2-step |

Figure 9:
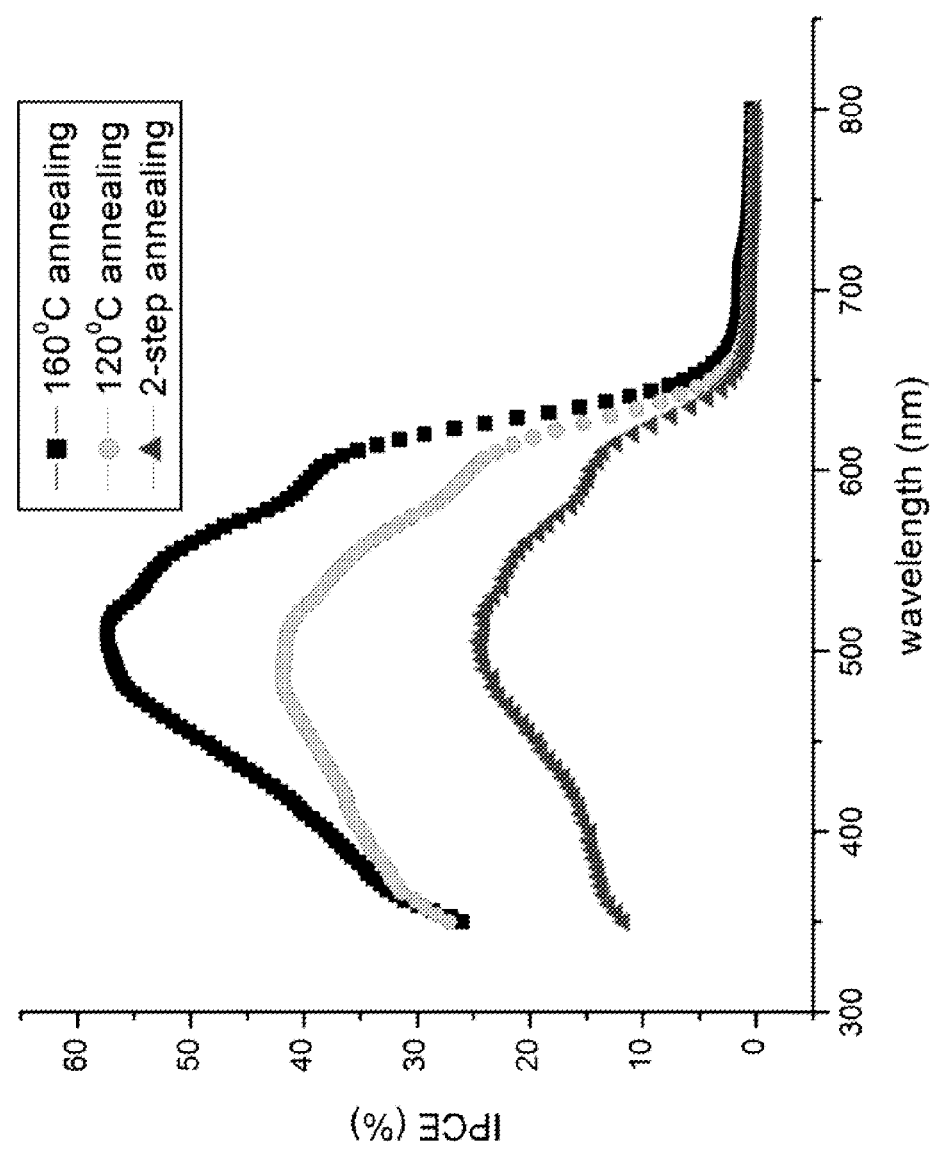
FIG. 9 is a graph showing the IPCE of four test cells measured under tungsten lamp illumination at various annealing conditions: 1-step annealing at 120° C. (light grey filled circle), or 160° C. (black filled square), and 2-step annealing (dark grey filled triangle).

IPCE measurement shows 2-step annealing was worse than 1 step annealing, seen in FIG. 9, which was consistent with IV measurements (data not shown). There is some inconsistency between PCE and IPCE for the cells annealed at 160° C. and 120° C.: the cell annealed at 160° C. has higher IPCE yet lower PCE than that at 120° C. IPCE measurement was done under illumination from Tungsten lamp, whereas IV was done under solar simulator which has different spectrum than that of the tungsten lamp. Nevertheless, the integration of IPCE should be proportional to $I_{sc}$. The device made by 1-step annealing at 160° C., though having smaller power conversion efficiency, actually has larger $I_{sc}$ (0.28 mA) than the one at 120° C. (0.23 mA). The ratio between integral of IPCE at 160° C. vs. 120° C. is about 1.3, and the ratio of $I_{sc}$ of the same devices was 1.2. The slight discrepancy might also come from the fact that the cells behave differently under strong (IV) and weak (IPCE) illuminations. Usually bi-molecular (BM) recombination sets in under high light intensity (solar simulator) (Shaheen, Brabec, Sariciftci, Padinger, Fromherz, and Hummelen, Appl. Phys. Lett. 2001, 78, 841) meaning the cell which has more prominent BM recombination will perform poorer with high intensity illumination such as that from the solar simulator. It might be that the cell annealed at 160° C. was affected by BM recombination more than the cell annealed at 120° C., due to more traps associated with rougher morphology serving as recombination centers. Further investigation of this discrepancy is under study.

AFM images of topography and phase of 4 different test arrays at different annealing conditions; an as-made cell, made using the method of Example 1 without annealing, having a roughness of 7.41 nm, 1-step annealing at 120° C. having a roughness of 6.60 nm, annealing at 160° C. having a roughness of 3.68 nm, and (d) 2-step annealing having a roughness of 9.76 nm. The 1-step annealing at 120° C. showed the improved film roughness and the best phase segregation of P3HT and PCBM, which explains why the device performance was the best, seen in FIGS. 8 and 9. Device by 2-step annealing has the smoothest film, however, the phase segregation was much less distinct. This indicates that P3HT chains and PCBM molecules are penetrating through each other more after the second annealing at 160° C., and form much smaller nano-domains, which are favorable for charge transport between the domains (Kline and McGehee, Morphology and Charge Transport in Conjugated Polymers. J of Macromol Sci, Part C: Polymer Reviews, 2006, 46(1): 27-45). However, recombination of photogenerated carriers might be enhanced due to the lack of separate pathways for electron sand holes, and that was why the device after 2-step annealing performed worse than after the $1^{st}$ annealing at 120° C., seen in FIGS. 8 and 9. 1-step annealing at higher temperature of 160° C. results in the roughest film (even rougher than the as-made device), and the P3HT phase and PCBM phase are hardly distinguishable. This rough film also further affects the interface between active layer and m-PEDOT, resulting in poor FF of the device, seen in FIGS. 8 and 9.

Figure 10:
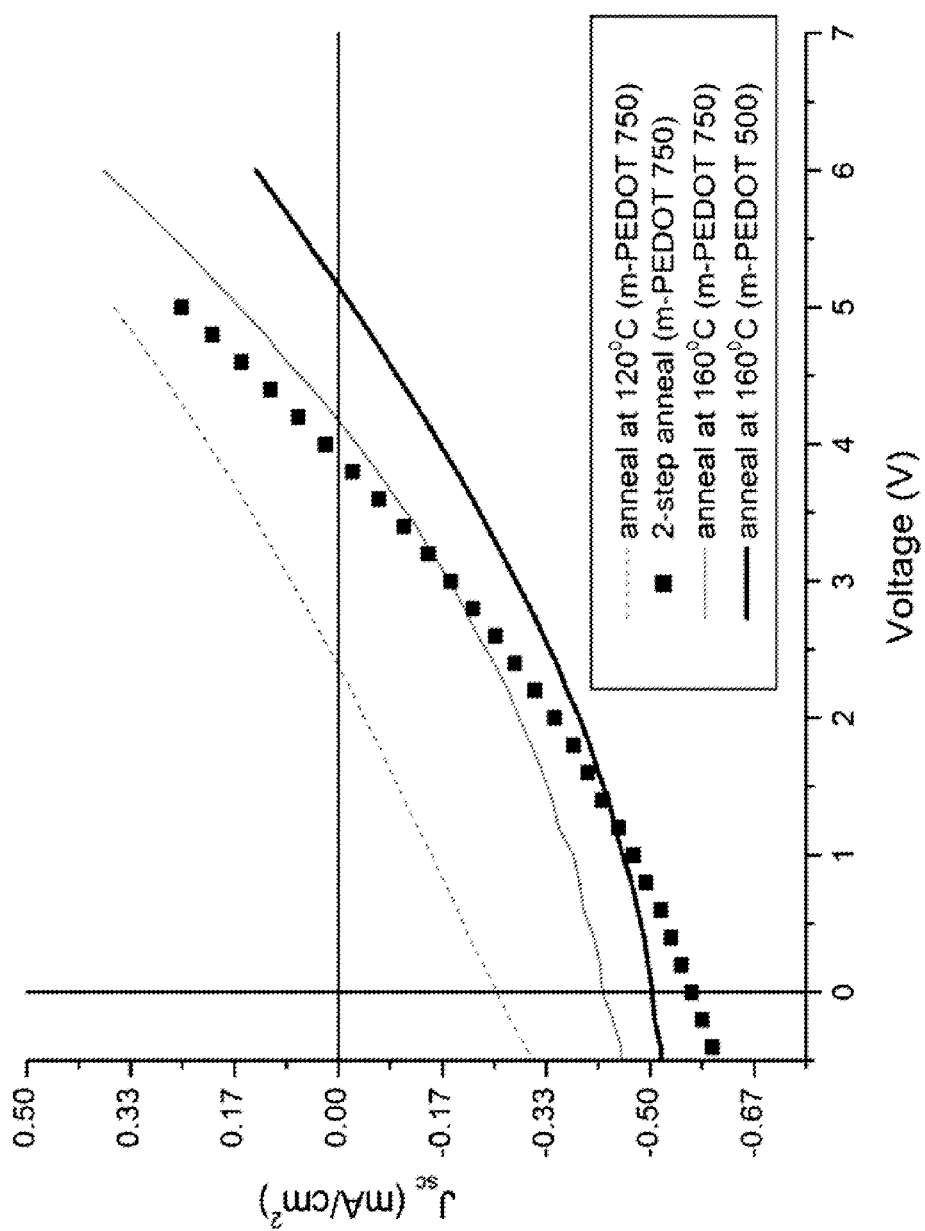
FIG. 10 is a graph showing the IV of 4 inverted spray-on array measured with AM1.5 solar illumination under various annealing conditions: 1-step annealing at 120° C. (dashed line), or 160° C. (light grey thin line), and 2-step annealing (black filled square). These 3 arrays use m-PEDOT 500 as anode. The $4^{th}$ array (thick dark grey line) uses m-PEDOT 500 as anode and was annealed at 160° C.

IV analysis was performed on 4 arrays under different annealing conditions measured with AM1.5 solar illumination, seen in FIG. 10. It is clear that 1-step annealing at the low temperature, i.e. 120° C., gives the worst result, 2-step annealing showed improved IV characteristics ($V_{oc}$, $J_{sc}$, FF and PCE) after the second high temperature annealing at 160° C. 1-step annealing at high temperature, i.e. 160° C., gives the best $V_{oc}$, and 2-step annealing yields the highest $J_{sc}$. In terms of anode, m-PEDOT 500 seems to give higher $V_{oc}$ than PEDOT 750, seen in Table 2. However, there is not much difference in PCE between 2-step annealing and 1-step annealing at 160° C., which is in contrast with the result of test device, seen in FIGS. 8 and 9. It is believed the annealing duration is probably too short for the array, since it has much larger area and contains much more materials.

TABLE 2

Array I-V characteristics comparison at various annealing conditions.

| Array number | $I_{sc}$ (mA) | $V_{oc}$ (V) | FF | η (%) | Annealing condition | m-PEDOT |
|---|---|---|---|---|---|---|
| 1 | 17.0 | 3.9 | 0.30 | 0.68 | 2 step | 750 |
| 2 | 11.5 | 4.0 | 0.39 | 0.62 | 2 step | 750 |
| 3 | 6.30 | 2.8 | 0.37 | 0.22 | 2 step | 750 |
| 4 | 13.0 | 4.0 | 0.33 | 0.56 | 160° C. 10 min | 750 |
| 5 | 15.0 | 5.2 | 0.33 | 0.86 | 160° C. 10 min | 500 |
| 6 | 12.0 | 5.8 | 0.30 | 0.70 | 160° C. 10 min | 500 |
| 7 | 11.1 | 5.2 | 0.35 | 0.67 | 160° C. 10 min | 500 |

Figure 11:
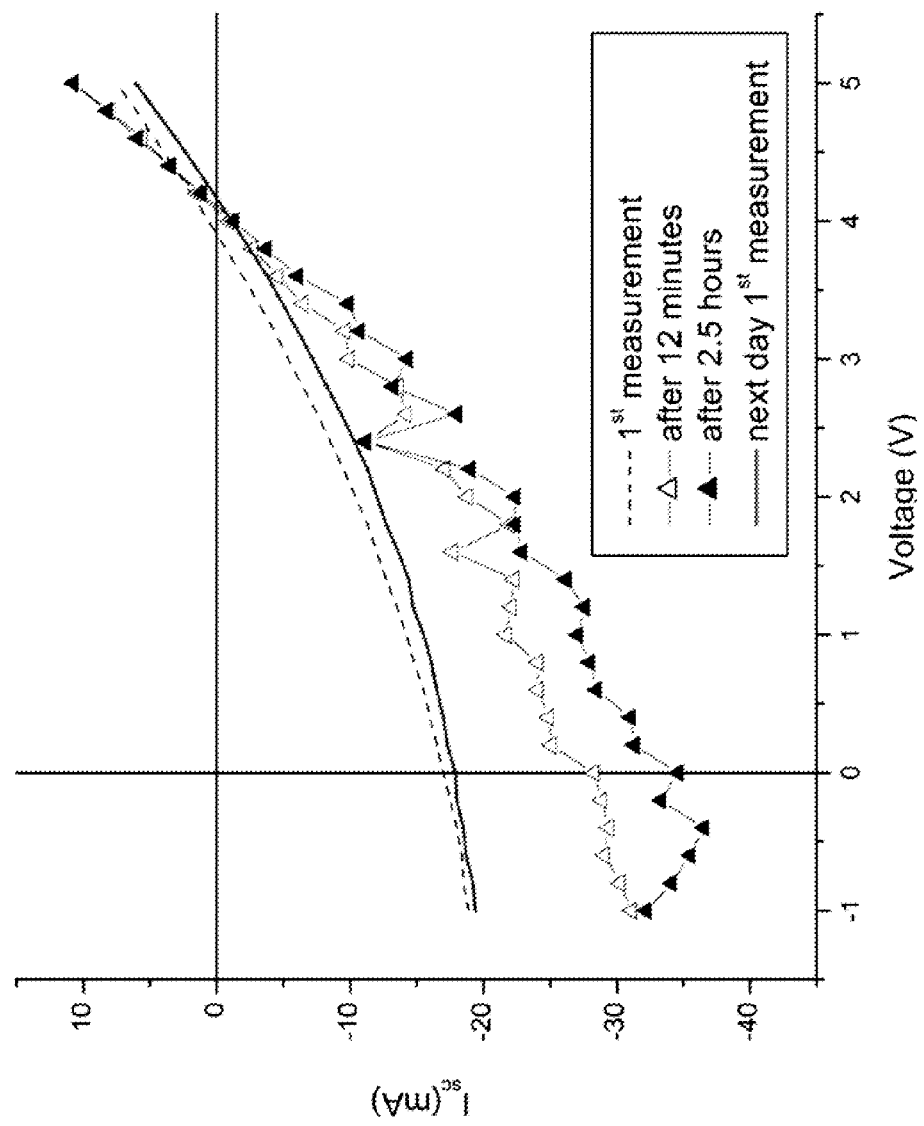
FIG. 11 is a graph showing the improvement of IV of an inverted array under continuous AM1.5 solar illumination. The first measurement was done right after the array was fabricated and encapsulated.

A very interesting phenomenon which was termed 'photo annealing' was observed, as seen in FIG. 11. Under constant illumination from the solar simulator, a sudden change of IV occurs after certain amount of time which is device dependent, ranging from 10 minutes to several hours. The device takes about 15 minutes, and reaches maximum PCE after 2.5 hours under illumination. The drastic change is mostly $I_{sc}$, which more than doubles from 17 mA to 35 mA after 2.5 hours. The change of $V_{oc}$ was marginal from 4.0V to 4.2V. The maximum PCE of the array was 1.80%. Table 3 listed the changes of other IV characteristics.

TABLE 3

Change of Array IV characteristics under solar illumination.

| Time | | $I_{sc}$ (mA) | $V_{oc}$ (V) | FF | η (%) |
|---|---|---|---|---|---|
| 1st day | 0 min | 17 | 4.0 | 0.30 | 0.68 |
| | 12 min | 28 | 4.2 | 0.35 | 1.40 |
| | 150 min | 35 | 4.2 | 0.37 | 1.80 |
| 2nd day | 0 min | 18 | 4.2 | 0.35 | 0.88 |

Furthermore, this sudden increase of $I_{sc}$ is also accompanied by a characteristic 'wiggles' on the IV curve. This cannot be due to encapsulation related change of light distribution inside the active layer, since these 'wiggles' have also been observed with the IV of test devices which are not encapsulated. 'Wiggles' only appear with the sprayed OPV device, both array and test device, not with spin-coated device. Without being bound to any specific theory, the phenomenon may be a result of the porosity of sprayed film being much larger than the spin-coated film, and polymer chains have much more loose arrangement in sprayed device, with the heat from solar illumination, the polymer chains relax more and the film nanomorphology was improved, with possibly PCBM penetrating into the voids between polymer chains and causing better phase segregation (Geiser, et al., Poly(3-hexylthiophene)/$C_{60}$ heterojunction solar cells: Implication of morphology on performance and ambipolar charge collection. Sol. Eng. & Sol. Cells 2008, 92(4), 464). This effect is similar to thermal annealing performed on hot plate. As temperature drops down, the polymer chains go back to its original configuration, and IV curve is back to its original one, manifesting certain kind of hysteresis. It also might be due to thermal activation of the previous deeply trapped carriers (i.e., polarons), which results in increased photocurrent at higher temperature (Graupner, Leditzky, Leising, and Scherf, Phys. Rev. B 1996, 54, 7610; Nelson, Organic photovoltaic films. Current Opinion in Solid State and Materials Science 2002, 6(1), 87-95). The wiggles indicate the nonuniformity of film morphology, and the overall boost of device performance is the result of 'photo annealing'.

This observation is against the conventional picture of organic solar cell, which normally shows degradation under solar illumination (Nelson, Organic photovoltaic films. Current Opinion in Solid State and Materials Science 2002, 6(1), 87-95; Dennler, et al., A new encapsulation solution for flexible organic solar cells. Thin Solid Films 2006, 511-512, 349-53). It was also found out that the performance enhancement under illumination only happened with sprayed devices, not the device made by spin coating. This means that solar cells made with our spray-on technique performs better under sunlight, which is beneficial for solar energy application. Further study of photo annealing dynamics and solar array lifetime is ongoing to unveil the optimal condition for solar array in field operations.

Example 6

Figure 12:
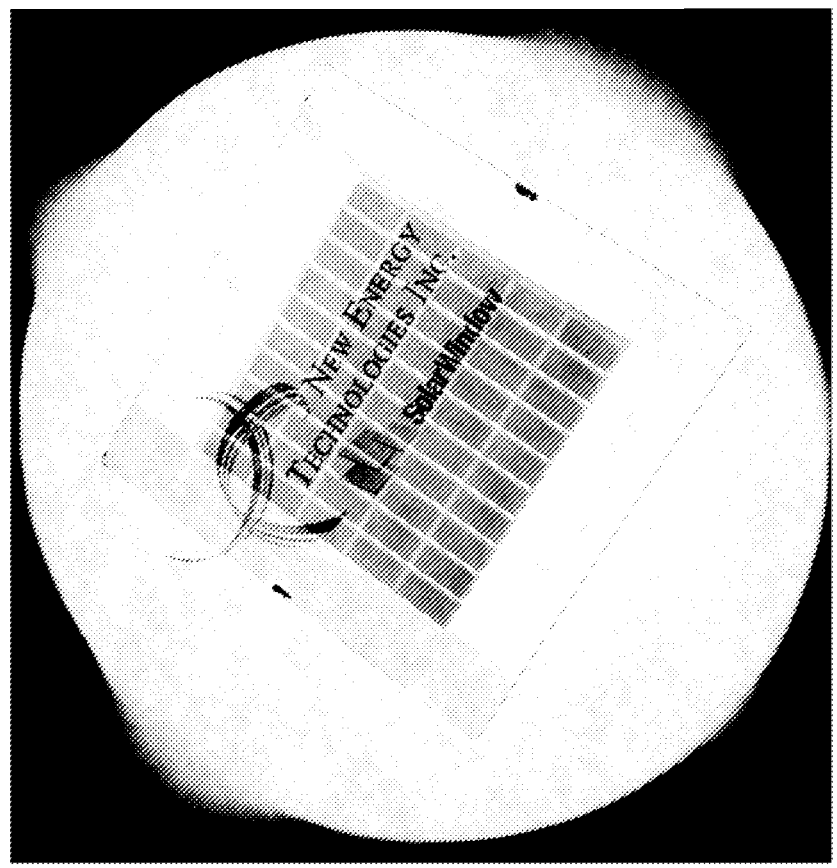
FIG. 12 is an image showing the transparency of manufactured sprayed solar array using the disclosed methods.

A large area organic array was fabricated using the all spay technique described in Example 1. A fully encapsulated 4"×4" array was prepared and found to have over 30% transparency, with power conversion efficiency (PCE) as high as 1.80% under constant illumination of simulated sunlight. Thermal annealing has proven to be essential to improve device PCE, and the optimal annealing conditions are not the same with small single cell and large solar array consisting of 50 cells. Systematic studies of optical, electronic and morphologic properties of the device reveals the influence of nanomorphology over device power conversion efficiency. Moreover, the discovery of photo annealing, i.e., more than 2-fold increase of solar cell PCE under solar irradiance and with hysteresis pattern, is in contrary to the normal understanding of organic solar cell degradation under sunlight. The fact that photo annealing was only observed with sprayed solar cell or arrays places underscores the novel advantageous solution for large scale, low-cost solution based solar energy applications. Analysis of the device showed that the solar array provided useful device transparency, as seen in FIG. 12.

In the preceding specification, all documents, acts, or information disclosed do not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

While there has been described and illustrated specific embodiments of an organic photovoltaic cell, it will be apparent to those skilled in the art that variations and modifications are possible without deviating from the broad spirit and principle of the present invention. It is intended that all matters contained in the foregoing description or shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween.

What is claimed is:

1. A semi-transparent organic photovoltaic cell comprising:
   a substrate;
   an indium tin oxide layer patterned on the substrate;
   $Cs_2CO_3$ layer disposed on the indium tin oxide layer, wherein the $Cs_2CO_3$ layer is sprayed-on the indium tin oxide layer and then annealed at about 150° C. for about 10 minutes inside a glovebox to establish a desired morphology of the $Cs_2CO_3$ layer and wherein the indium tin oxide layer and the $Cs_2CO_3$ layer form a cathode layer;
   an active layer of poly(3-hexylthiophene) and 6,6-phenyl C61 butyric acid methyl ester disposed on the layer of $Cs_2CO_3$, wherein the active layer comprises a plurality of layers of a solution of poly(3-hexylthiophene) and 6,6-phenyl C61 butyric acid methyl ester that are sprayed-on and then heated to about 60° C. for about 48 hours, the plurality of layers forming a final multi-layer active layer having a total thickness of about 200 nm to about 300 nm; and
   an anode layer comprising poly (3,4) ethylenedioxythiophene:poly-styrenesulfonate mixed with 5 vol. % of dimethylsulfoxide deposited on the active layer to form a semi-transparent organic photovoltaic cell, wherein the semi-transparent organic photovoltaic cell exhibits a transmission of at least 30% in the visible to near infrared (IR) range and, in response to an illumination incident upon the cathode layer for a duration of at least 2.5 hours, the semi-transparent organic photovoltaic cell exhibits a short circuit current ($I_{sc}$) that is approximately double the short circuit current ($I_{sc}$) exhibited by the semi-transparent organic photovoltaic cell when the cathode layer has not been illuminated.

2. The semi-transparent organic photovoltaic cell of claim 1, wherein the substrate is low alkaline earth boro-aluminosilicate glass, cloth, or plastic.

3. The semi-transparent organic photovoltaic cell of claim 2, wherein the substrate is cloth and wherein the cloth is nylon cloth, cotton cloth, polyester cloth, hemp cloth, or bamboo cloth.

4. The semi-transparent organic photovoltaic cell of claim 1, wherein the active layer of poly(3-hexylthiophene) and 6,6-phenyl C61 butyric acid methyl ester has a layer thickness of about 300 nm.

5. The semi-transparent organic photovoltaic cell of claim 1, wherein the $Cs_2CO_3$ layer is about 5 Å to about 15 Å thick.

6. The semi-transparent organic photovoltaic cell of claim 1, wherein the $Cs_2CO_3$ layer is about 15 Å thick.

7. The semi-transparent organic photovoltaic cell of claim 1, wherein the anode layer comprising poly (3,4) ethylenedioxythiophene:poly-styrenesulfonate mixed with 5 vol. % of dimethylsulfoxide is about 100 nm to about 600 nm.

8. The semi-transparent organic photovoltaic cell of claim 1, wherein the anode layer comprising poly (3,4) ethylenedioxythiophene:poly-styrenesulfonate mixed with 5 vol. % of dimethylsulfoxide is about 100 nm to about 300 nm.

9. The semi-transparent organic photovoltaic cell of claim 1, wherein the thickness of the active layer of poly(3-hexylthiophene) and 6,6-phenyl C61 butyric acid methyl is about 200 nm and the thickness of the anode layer comprising poly (3,4) ethylenedioxythiophene:poly-styrenesulfonate mixed with 5 vol. % of dimethylsulfoxide is about 100 nm to about 600 nm.

10. The semi-transparent organic photovoltaic cell of claim 1, wherein the thickness of the anode layer comprising poly (3,4) ethylenedioxythiophene:poly-styrenesulfonate mixed with 5 vol. % of dimethylsulfoxide is about 200 nm.

11. The semi-transparent organic photovoltaic cell of claim 1, wherein the thickness of the active layer of poly (3-hexylthiophene) and 6,6-phenyl C61 butyric acid methyl is about 200 nm and the thickness of the anode layer comprising poly (3,4) ethylenedioxythiophene:poly-styrenesulfonate mixed with 5 vol. % of dimethylsulfoxide is about 100 nm.

12. A semi-transparent organic photovoltaic cell array comprising a plurality of semi-transparent organic photovoltaic cells coupled in series, wherein each semi-transparent organic photovoltaic cell comprises
 a substrate;
 an indium tin oxide layer patterned on the substrate;
 $Cs_2CO_3$ layer disposed on the indium tin oxide layer, wherein the $Cs_2CO_3$ layer is sprayed-on the indium tin oxide layer and then annealed at about 150° C. inside a glovebox for about 10 minutes to establish a desired morphology of the $Cs_2CO_3$ layer and wherein the indium tin oxide layer and the $Cs_2CO_3$ layer form a cathode layer;
 an active layer of poly(3-hexylthiophene) and 6,6-phenyl C61 butyric acid methyl ester disposed on the layer of $Cs_2CO_3$, wherein the active layer comprises a plurality of layers of a solution of poly(3-hexylthiophene) and 6,6-phenyl C61 butyric acid methyl ester that are sprayed-on and then heated to about 60° C. for about 48 hours, the plurality of layers forming a final multi-layer active layer having a total thickness of about 200 nm to about 300 nm; and
 an anode layer comprising poly (3,4) ethylenedioxythiophene:poly-styrenesulfonate mixed with 5 vol. % of dimethylsulfoxide deposited on the active layer to form a semi-transparent organic photovoltaic cell, wherein the semi-transparent organic photovoltaic cell exhibits a transmission of at least 30% in the visible to near infrared (IR) range and, in response to an illumination incident upon the cathode layer for a duration of at least 2.5 hours, the semi-transparent organic photovoltaic cell exhibits a short circuit current ($I_{sc}$) that is approximately double the short circuit current ($I_{sc}$) exhibited by the semi-transparent organic photovoltaic cell when the cathode layer has not been illuminated.

13. The semi-transparent organic photovoltaic cell array of claim 12, wherein the array further comprises ten organic photovoltaic cells coupled in series in one row, and 5 rows in parallel connection.

14. The semi-transparent organic photovoltaic cell array of claim 12, wherein the array comprises four organic photovoltaic cells disposed on a 1"×1" substrate.

* * * * *